United States Patent
Sueoka et al.

(10) Patent No.: US 7,026,855 B2
(45) Date of Patent: Apr. 11, 2006

(54) SEMICONDUCTOR DEVICE TO PREVENT A CIRCUIT FROM BEING INADVERTENTLY ACTIVE

(75) Inventors: Atsushi Sueoka, Fujisawa (JP); Hiroaki Nakano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/853,260

(22) Filed: May 26, 2004

(65) Prior Publication Data

US 2005/0195012 A1    Sep. 8, 2005

(30) Foreign Application Priority Data

Mar. 2, 2004   (JP) .............................. 2004-057977

(51) Int. Cl.
*H03L 5/00*    (2006.01)

(52) U.S. Cl. ......................................... 327/333; 326/68

(58) Field of Classification Search ................ 327/333, 327/51, 52, 55, 65, 67; 326/63, 68, 81, 83
See application file for complete search history.

(56) References Cited

U.S. PATENT DOCUMENTS 4,996,443 A    2/1991  Tateno ........................ 326/68

5,448,523 A *  9/1995  Lewis et al. ............ 365/189.07
5,867,047 A *  2/1999  Kraus .......................... 327/143
6,417,716 B1*  7/2002  Riccio ......................... 327/333
2004/0140842 A1*  7/2004  Lee et al. .................... 327/333

FOREIGN PATENT DOCUMENTS

JP         06308171 A   * 11/1994
JP         2001-68978     3/2001

* cited by examiner

*Primary Examiner*—Linh My Nguyen
(74) *Attorney, Agent, or Firm*—Oblon, Spivak, McClelland, Maier & Neustadt, P.C.

(57) ABSTRACT

A semiconductor device includes a first circuit block which operates on a first power supply voltage to output a first digital signal having an amplitude equal to that of the first power supply voltage, a level shifting circuit into which the first digital signal is input and which converts the amplitude of the first digital signal to an amplitude equal to that of a second power supply voltage to output as a second digital signal via an output terminal, a second circuit block which operates on the second power supply voltage and into which the second digital signal is input, and a monitor circuit which produces a first signal to set the output terminal of the level shifting circuit to a predetermined potential in a case where the first power supply voltage drops below a predetermined voltage level.

12 Claims, 6 Drawing Sheets

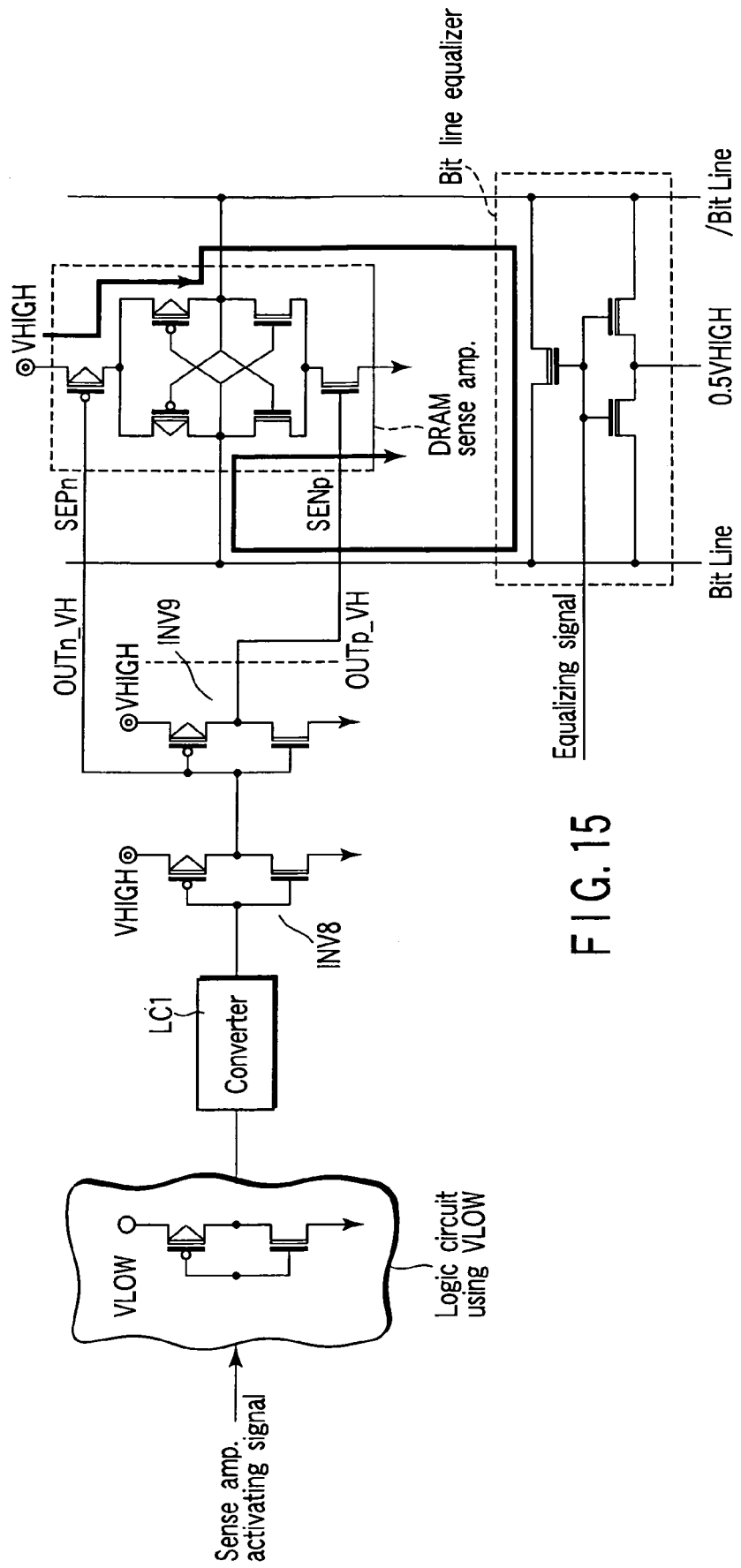
F I G. 15

SEMICONDUCTOR DEVICE TO PREVENT A CIRCUIT FROM BEING INADVERTENTLY ACTIVE

CROSS-REFERENCE TO RELATED APPLICATIONS

This application is based upon and claims the benefit of priority from prior Japanese Patent Application No. 2004-057977, filed Mar. 2, 2004, the entire contents of which are incorporated herein by reference.

BACKGROUND OF THE INVENTION

1. Field of the Invention

The present invention relates to a semiconductor device including a level shifting circuit between circuit blocks using two different power supplies, particularly a level shifting circuit which inactivates a circuit block using one power supply at a time when a voltage of the other power supply abnormally drops.

2. Description of the Related Art

In general, an appropriate power supply voltage needs to be supplied to each circuit block in order to allow a plurality of circuit blocks (function blocks) to perform desired operations in an integrated circuit, and a multi-power supply has been used. A level shifting circuit for shifting a voltage level is used in an interface between the circuit blocks using two power supplies with different voltages.

In a most general method of shifting the level, an output signal having a second voltage level is obtained from an output terminal of a flip flop, which operates at the second voltage level (logic level), using a complimentary pair of signals having a first voltage level (logic level) as input signals of the flip flop. This type of level shifting circuit has various problems, and improvements have been attempted.

For example, when a first power supply voltage changes to a predetermined voltage level (first voltage level) from a GND level, a feedthrough current temporarily flows in a part of the flip flop. This feedthrough current can be suppressed, when a capability ratio of Nch to Pch transistor is increased, but this causes a problem that a size of the transistor increases. In Jpn. Pat. Appln. KOKAI Publication No. 2001-68978, transistors driven at a third voltage level which is an intermediate voltage between first and second voltage levels are inserted in two main current paths of the flip flop, and a voltage between gate and source of the cross-coupled transistors is lowered to reduce the feedthrough current.

By the way, the semiconductor device is controlled by an input signal from the outside. An amplitude of the input signal is limited to one voltage amplitude even when there is a circuit block using a plurality of power supply circuits, and the amplitude of a lowest first power supply voltage is used in many cases. At this time, the circuit block operating at a second voltage receives the input signal from the outside after passing through the level shifting circuit.

When there are a plurality of power supplies, all the power supply voltages do not necessarily constantly indicate a normal value. It is now assumed that a voltage value of a first power supply which supplies a first voltage level drops to such an extent that logic circuits such as an inverter do not operate, whereas only a second power supply which supplies a second voltage level indicates a defined output. The circuit block which operates from the second power supply receives a signal obtained by shifting the level of the input signal with the first voltage level through the level shifting circuit. Now, since the first power supply is in an unstable state before reaching the first voltage level, an output after the level shifting is also unstable, and the circuit block to which the output is supplied is not controlled by the input signal from the outside. However, the second power supply, which is in a stable state, has been supplied to the circuit block. Therefore, the circuit block is probably inadvertently activated. This abnormal operation has to be avoided especially in a case where current consumption of the circuit block using the second power supply is large.

In a case where the output voltage of the first power supply on a low voltage side drops to such an extent that the logic circuit is incapable of operating, the circuit block using the second power supply to which the state of the external input signal is indirectly transmitted via the level shifting circuit is brought into a non-controlled state. Accordingly, the circuit block using the second power supply is inadvertently active, and there is a possibility that a current is passed from the second power supply on a high voltage side.

Therefore, there has been a demand for realization of a semiconductor device which can prevent a circuit from being inadvertently active, the circuit using a second power supply voltage and being supplied with an input signal level-shifted from a first voltage level which is supplied from the first power supply, in a case where the first voltage level drops below a defined value.

BRIEF SUMMARY OF THE INVENTION

According to one aspect of the invention, there is provide a semiconductor device which comprises:

a first circuit block which operates on a first power supply voltage to output a first digital signal having an amplitude equal to that of the first power supply voltage;

a level shifting circuit into which the first digital signal is input and which converts the amplitude of the first digital signal to an amplitude equal to that of a second power supply voltage to output as a second digital signal via an output terminal;

a second circuit block which operates by the second power supply voltage and into which the second digital signal is input; and a monitor circuit which produces a first signal to set the output terminal of the level shifting circuit to a predetermined potential in a case where the first power supply voltage drops below a predetermined voltage level.

BRIEF DESCRIPTION OF THE SEVERAL VIEWS OF THE DRAWING

FIG. 15 is a circuit diagram according to a fourth embodiment, in which the level shifting circuit of FIG. 1 is applied to a DRAM sense amplifier circuit.

DETAILED DESCRIPTION OF THE INVENTION

Figure 1:
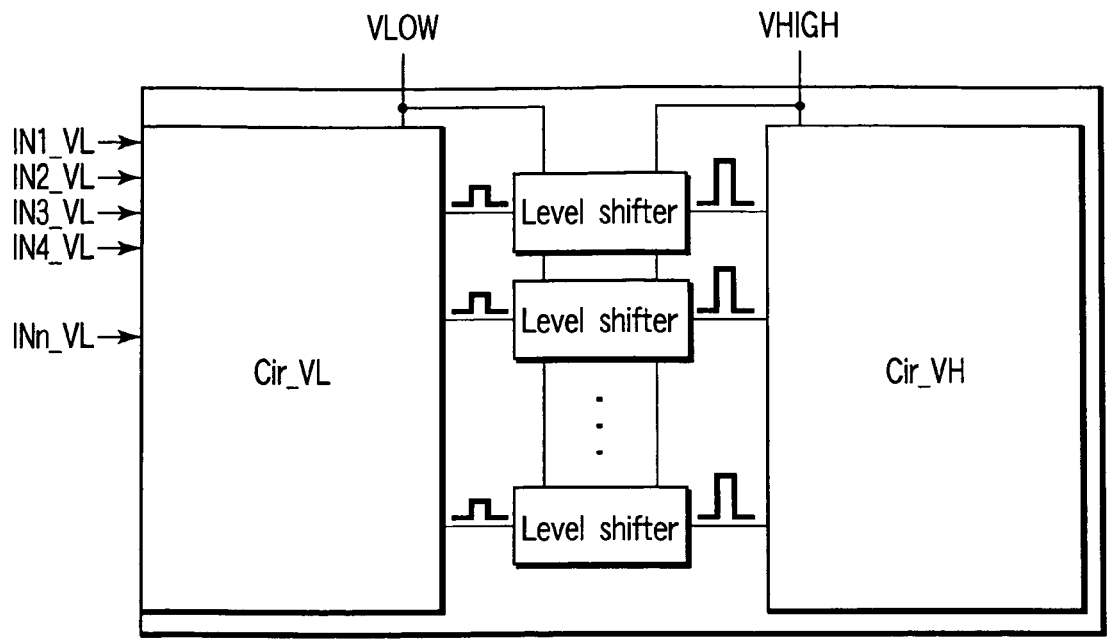
FIG. 1 is a block diagram showing an example in which a level shifting circuit is used.

First, an outline of a level shifting circuit (level shifter) will be described prior to description of embodiments. As shown in FIG. 1, a plurality of signals INn_VL having a voltage amplitude VLOW are input into a first circuit block Cir_VL which operate at a first power supply voltage VLOW. An input signal 1 is represented by IN1_VL, an input signal 2 is represented by IN2_VL, and an input signal n (n is an integer) is represented by INn_VL. Note that a voltage amplitude of an input signal is equal to the first power supply voltage VLOW.

Moreover, a second power supply voltage VHIGH is supplied to a second circuit block Cir_VH. The first and second power supply voltages have a magnitude relation of VLOW<VHIGH. There are a plurality of power supply voltages in this manner, because the circuit Cir_VL using VLOW and the circuit Cir_VH using VHIGH exist on the same chip.

Here, control of the circuit block Cir_VH using the second power supply voltage VHIGH by the input signal INn_VL will be described. In a circuit inside the chip, both the circuit block Cir_VL using the first power supply voltage VLOW and the circuit block Cir_VH using the second power supply voltage VHIGH are controlled by the input signal INn_VL.

Figure 2:
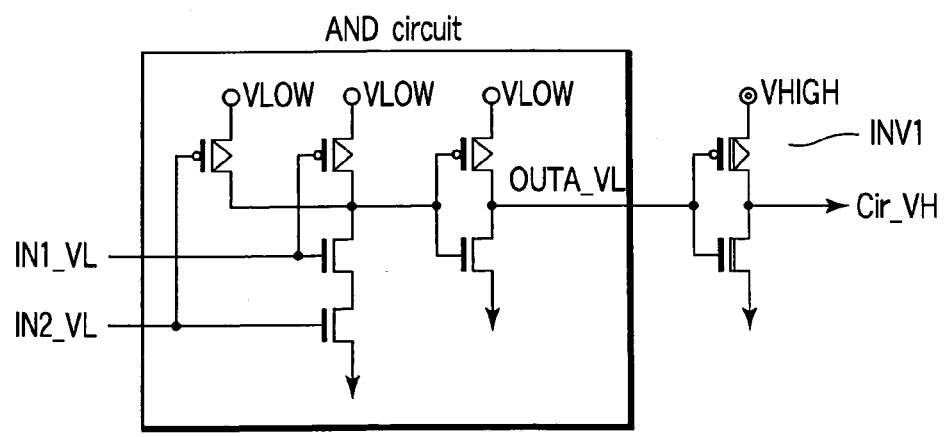
FIG. 2 is an explanatory view of a necessity for the level shifting circuit.

Incidentally, since the voltage amplitude of the input signal INn_VL is of the first power supply voltage VLOW, a signal having this amplitude cannot be input as such into the circuit block using the second power supply voltage VHIGH. For example, it is assumed that at the time of the input signal IN1_VL=1, IN2_VL=1, the circuit block Cir_VH is set to be active. In this case, as shown in FIG. 2, IN1_VL and IN2_VL are input into an AND circuit which operates on the first power supply voltage VLOW to produce an output OUTA_VL.

However, this output signal OUTA_VL cannot be used as an input of the circuit block Cir_VH. For example, it is assumed that the circuit block Cir_VH has received the output signal OUT_VL via an inverter INV1 which operates on the second power supply voltage. When the output signal OUTA_VL is 0 (GND), a PMOS transistor of the inverter INV1 turns on, an NMOS transistor turns off, and therefore a logic value is correctly transmitted. However, when the output signal OUTA_VL is 1 (VLOW), a voltage Vgs between gate and source of the PMOS transistor of the inverter INV1 is Vgs=OUTA_VL-VHIGH. Since this value does not equal to a threshold value of the PMOS transistor or less, the PMOS transistor does not turn off, and an output of the inverter INV indicates an intermediate value between VHIGH and GND.

Figure 3:
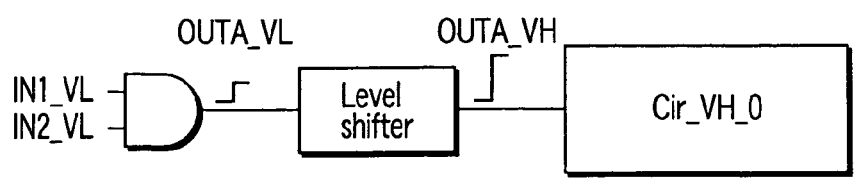
FIG. 3 is an explanatory view showing that a circuit using a VHIGH power supply is controlled by a signal via the level shifting circuit.
Figure 4:
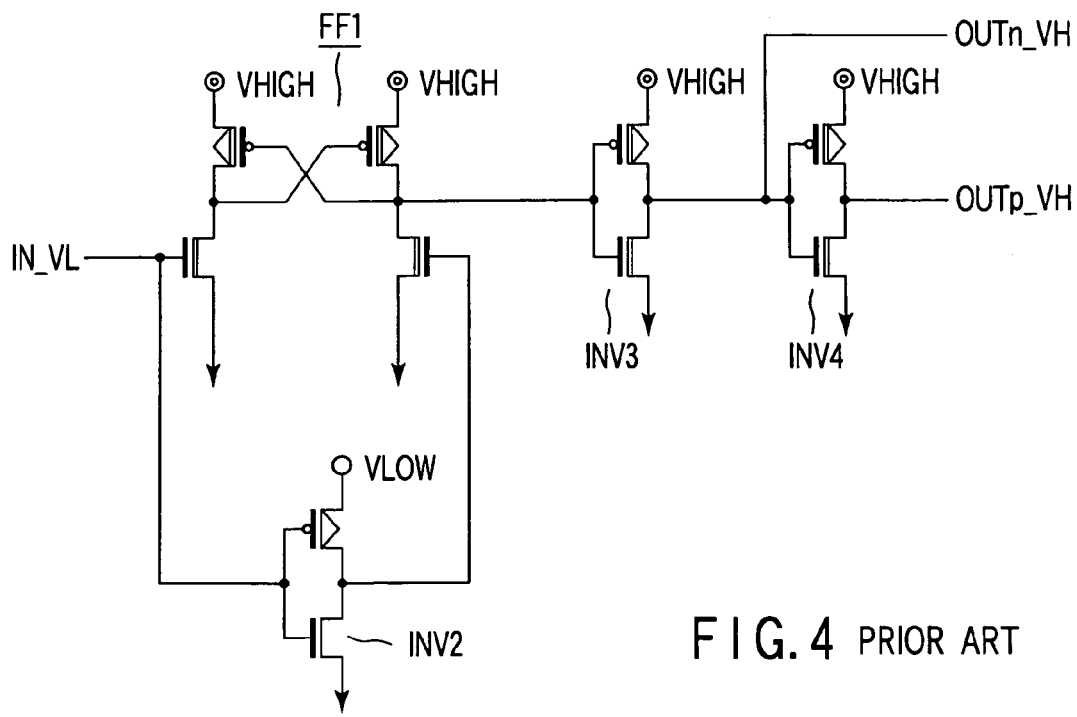
FIG. 4 is a circuit diagram of a conventional level shifting circuit.

To solve the problem, the output signal OUTA_VL of the AND circuit has to be converted to a signal OUTA_VH having a voltage amplitude VHIGH through a level shifter as shown in FIG. 3. As shown in FIG. 4, a combination of inverters INV2 to INV4 and flip flop FF1 is known as the level shifter, and is frequently used.

Incidentally, since a circuit using the second power supply voltage VHIGH is controlled via the level shifter, the following problem occurs. It is now assumed that the voltage value of the first power supply voltage VLOW drops to such an extent that the logic circuits such as the inverter do not operate, whereas only the second power supply voltage VHIGH indicates a defined value.

As described above, the circuit block Cir_VH operating on the second power supply voltage VHIGH receives a signal obtained through the level shifter by shifting the level of the signal having the amplitude of the first power supply voltage VLOW input from the outside. Now since the first power supply voltage VLOW does not indicate a defined voltage value, the amplitude of the input signal of the level shifter is also unstable. Therefore, the output after the level shifting is also unstable, and the circuit block Cir_VH is not controlled by the input signal INn_VL.

However, only the second power supply voltage VHIGH is normally supplied to the circuit block Cir_VH. Therefore, the circuit block Cir_VH is probably inadvertently activated. This has to be avoided especially in a case where current consumption of the circuit block using the second power supply voltage VHIGH is large. The embodiments described hereinafter solve the above-described problems.

The embodiments of the present invention will be described hereinafter with reference to the drawings.

(First Embodiment)

Figure 6:
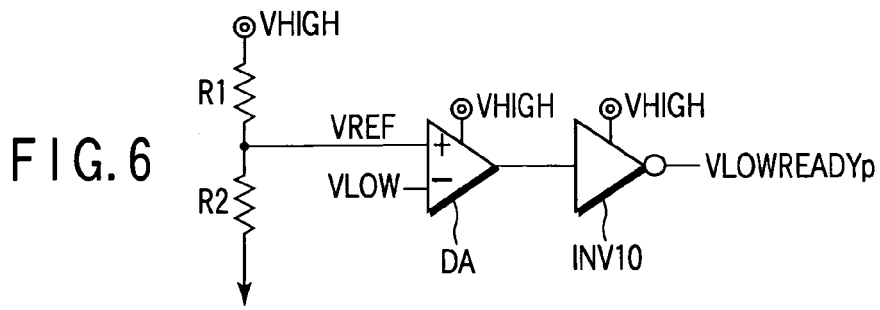
FIG. 6 is a circuit diagram of a VLOW monitor circuit for use in the first embodiment.
Figure 7:
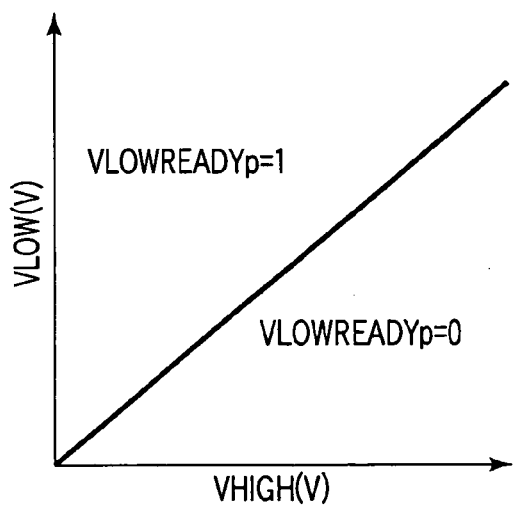
FIG. 7 is a characteristic diagram showing an output state of the VLOW monitor circuit of FIG. 6 in relation to the power supply voltages VHIGH/VLOW.
Figure 5:
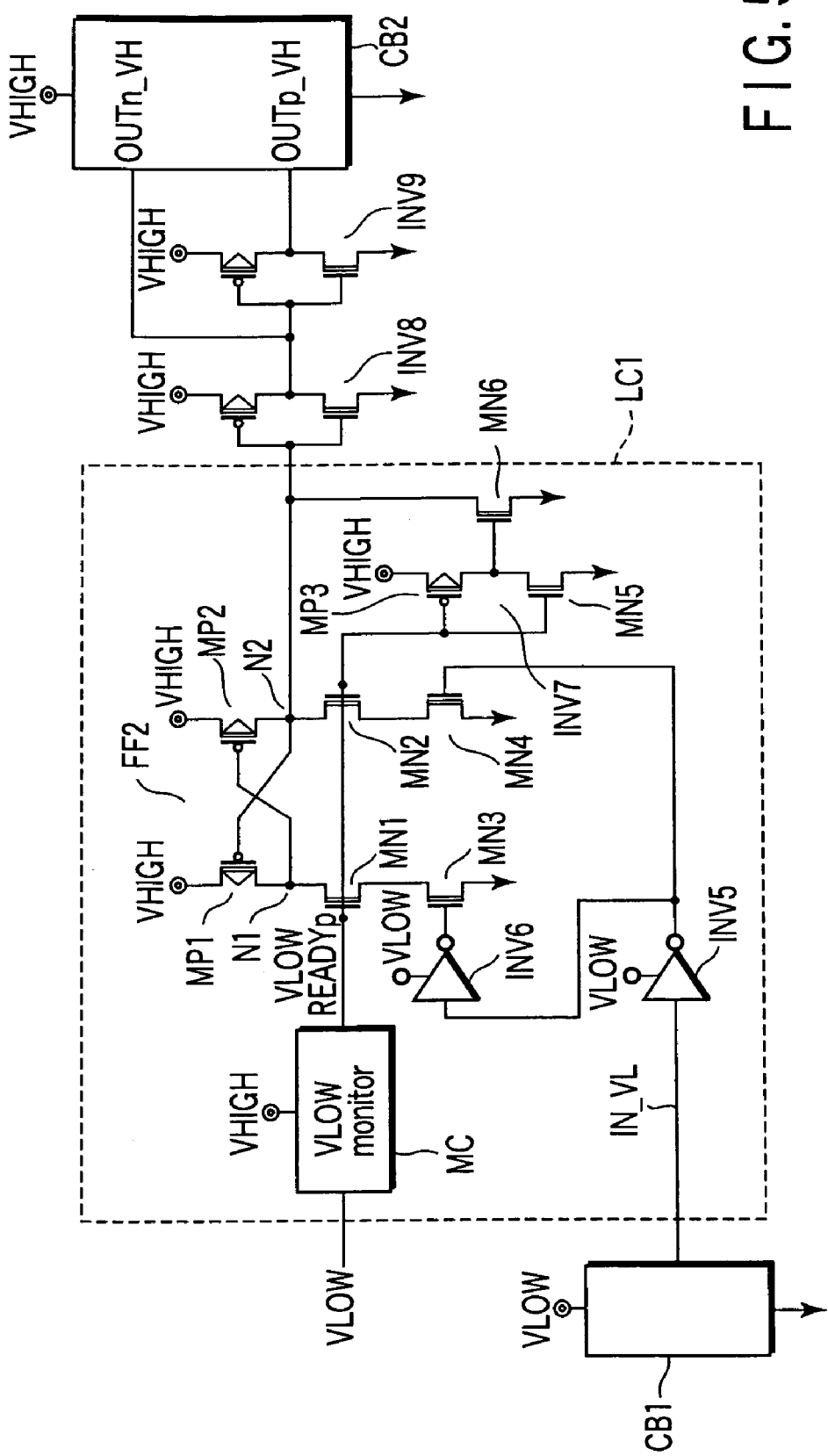
FIG. 5 is a circuit diagram of the level shifting circuit according to a first embodiment of the present invention.

FIG. 5 is a circuit diagram of a semiconductor device including a level shifting circuit according to a first embodiment of the present invention, FIG. 6 is a circuit diagram of a monitor circuit MC which monitors a first power supply voltage VLOW in FIG. 5, and FIG. 7 is a characteristic diagram showing an output value status of the monitor circuit MC of FIG. 6 in relation to power supply voltages VHIGH/VLOW.

In FIG. 5, an input signal IN_VL is input into INV5 from a first circuit block CB1. A complementary pair of signals produced from the input signal IN_VL via INV5, INV6 operating on the first power supply voltage VLOW are supplied as input signals of a flip flop FF2 operating on the second power supply voltage VHIGH. The flip flop FF2 comprises cross-coupled PMOS transistors MP1, MP2, and NMOS transistors MN3, MN4 connected to current paths of these transistors in tandem. The complementary pair of signals are input into gates of the NMOS transistors MN3, MN4.

A signal output from an output node N2 of FF2 is output as an output signal OUTn_VH via an inverter INV8 operating on the second power supply voltage VHIGH, or as an output signal OUTp_VH via inverters INV8, INV9. It is now assumed that if OUTp_VH turns to HIGH, a subsequent circuit block receives this output and is activated.

One of characteristics of the first embodiment lies in that a VLOW monitor MC is disposed to monitor the first power supply voltage VLOW. By this output signal, conduction of NMOS transistors MN1, MN2 disposed in two current paths of the flip flop FF2 is controlled, and a control circuit comprising a PMOS transistor MP3 and NMOS transistors MN5, MN6 is driven to control a potential of the output node N2 of the flip flop FF2.

FIG. 6 is a circuit diagram of the monitor circuit MC. The circuit monitors whether or not an output of the first power supply voltage VLOW is not less than a constant value. In the monitor circuit MC, a voltage between the second power supply voltage VHIGH and GND is divided by resistors R1, R2 to obtain a reference potential VREF. The voltage value of the reference potential VREF is compared with that of the first power supply voltage VLOW by a differential amplifier DA operating by the second power supply voltage VHIGH, and reversed by an inverter INV10 operating on the second power supply voltage VHIGH to obtain an output signal VLOWREADYp.

When a resistance ratio of the resistor R1 to R2 is adjusted, it can be judged that a potential of VLOW is low if the relation VLOW<VHIGH×R2/(R1+R2) is satisfied (in this case, R1, R2 are resistance values).

A result of the monitoring by the VLOW monitor circuit MC is output as a digital signal VLOWREADYp, and this signal is transmitted to the level shifting circuit. That is, when an output voltage of the first power supply voltage VLOW is normal, VLOWREADYp=1 (VHIGH). When the voltage is abnormal, VLOWREADYP=0 (GND). FIG. 7 shows the relation between the output value of the monitor circuit MC and VHIGH/VLOW.

Here, it is noted that the first power supply voltage VLOW is not used in the circuit until this VLOWREADYp is produced. If a circuit using the first power supply voltage VLOW exists, the operation is not performed unless both the first and second power supply voltages VLOW and VHIGH are normal. In this case, abnormality of the first power supply voltage VLOW cannot be detected.

In the level shifting circuit of the first embodiment shown in FIG. 5, a state of the output signal OUTp_VH or OUTn_VH corresponding to the input signal IN_VL changes according to the state of VLOWREADYp. It is to be noted that the output signal OUTp_VH or OUTn_VH is output to a second circuit block CB2. First, at the time of VLOW-READYp=1 (VHIGH), the NMOS transistor MN1, MN2 and MN5 turn on, MP3 and MN6 turn off, and the output signal OUTp_VH having a logic value equal to that of the input signal IN_VL is output via the inverters INV8, INV9.

That is, when IN_VL=1 (VLOW), OUTp_VH=1 (VHIGH), the logic value is equal, but the voltage value is converted to VHIGH. When IN_VL=0 (GND), OUTp_VH=0 (GND). An operation of a usual level shifting circuit is performed, and the same function as that of a conventional art is fulfilled.

When the first power supply voltage VLOW is lower than VREF, VLOWREADYp changes to 0 owing to the operation of the VLOW monitor circuit MC shown in FIG. 6. Then, the NMOS transistors MN1, MN2 turn off, and the state of IN_VL is not reflected in nodes N1 and N2. Moreover, the gate of the NMOS transistor MN6 change to a VHIGH level owing to an inverter INV7 comprised of the PMOS transistor MP3 and NMOS transistor MN5, and the NMOS transistor MN6 turns on.

As a result, the node N2 changes to a GND level, the PMOS transistor MP1 turns on, and further the node N1 changes to VHIGH. Accordingly, the PMOS transistor MP2 turns off, and a feedthrough path connected to the ground potential GND from the power supply voltage VHIGH via the MOS transistors MP2, MN6 momentarily disappears. Since the node N2 is at the GND level, OUTn_VH=1 (VHIGH), which is the output of the inverter INV8, and OUTp_VH=0, which is the output of the inverter INV9.

In this manner, when the voltage of the first power supply voltage VLOW is lower than a defined value, and VLOW-READYp=0, the output of the level shifting circuit inactivates the subsequent second circuit block CB2. It is to be noted that when the subsequent second circuit block CB2 is inactivated by a high level signal, an output signal indicating OUTn_VH=1 may be used. Therefore, the circuit block CB2 controlled by this OUTP_VH (or OUTn_VH) is not brought into an active state. Even when the first power supply voltage VLOW is low, an unnecessary current is not passed to the second circuit block from the second power supply voltage VHIGH.

Moreover, in the present embodiment, there are only two power supply voltages, but the number of power supply voltages is not limited to two. When there are three power supply voltages VLOW, VHIGH1, VHIGH2, the present embodiment may be applied between two power supply voltages VLOW and VHIGH1, VLOW and VHIGH2. This also applies, even when there are more power supply voltages.

(Second Embodiment)

Figure 8:
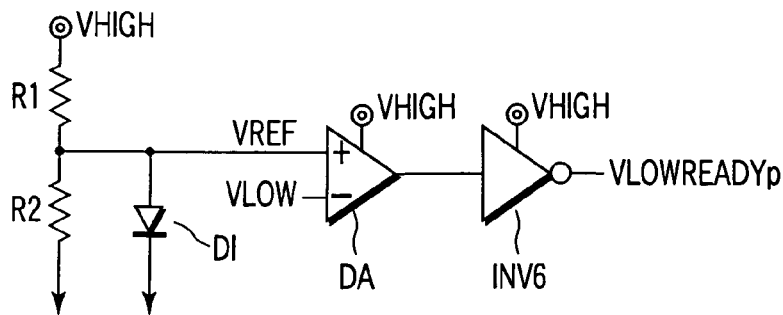
FIG. 8 is a circuit diagram of the VLOW monitor circuit according to a second embodiment.

A second embodiment is different from the first embodiment in a generation method of a reference potential VREF of the VLOW monitor circuit MC. In the first embodiment, a voltage between the second power supply voltage VHIGH and ground potential GND is simply divided by resistors R1 and R2. In the second embodiment, as shown in FIG. 8, a VREF node is connected to an anode of a diode DI.

When the reference voltage VREF simply determined by a resistance ratio is used as in the first embodiment, a voltage range in which the first power supply voltage VLOW is usable is also reduced with an increase of the voltage value of the second power supply voltage VHIGH. For example, when R1=R2, and VLOW<0.5 VHIGH, it is judged that VLOW is low. Therefore, when VHIGH=1.2 V and VLOW=0.6 V or less, or VHIGH=2.0 V and VLOW=1.0 V or less, it is judged that VLOW is low. Therefore, the output of the level shifting circuit is VLOWREADYp=0.

Figure 9:
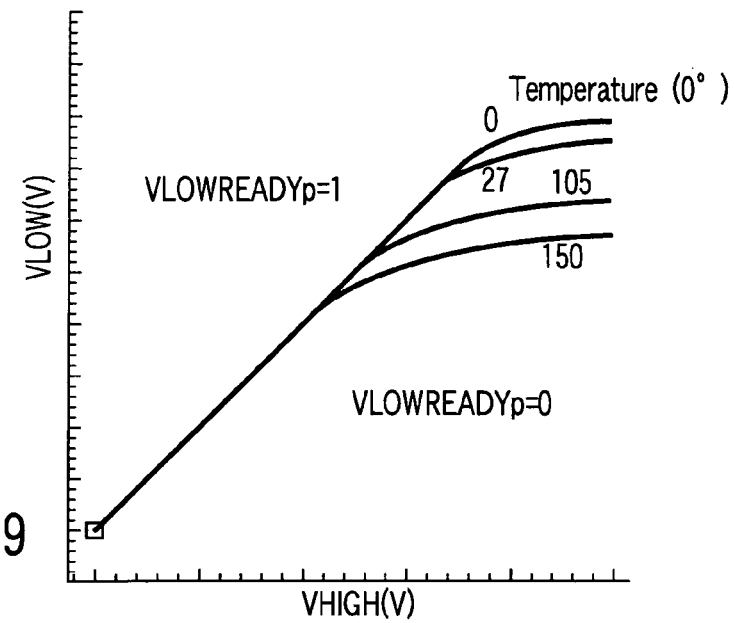
FIG. 9 is a characteristic diagram showing the output state of the VLOW monitor circuit of FIG. 8 in relation to the power supply voltages VHIGH/VLOW and including temperature characteristics.

When the diode DI is disposed, VREF is clamped by a forward bias voltage of the diode. Therefore, even when the second power supply voltage VHIGH is in a comparatively high potential, the first power supply voltage VLOW having a low voltage is usable. Additionally, since the forward voltage of the diode changes in a negative direction with a temperature change, as shown in FIG. 9, there is a disadvantage that this effect is reduced with a drop of temperature. It is to be noted that FIG. 9 is a characteristic diagram including temperature characteristics and showing the output state of the monitor circuit of FIG. 8 in relation to the power supply voltages VHIGH/VLOW.

Figure 10:
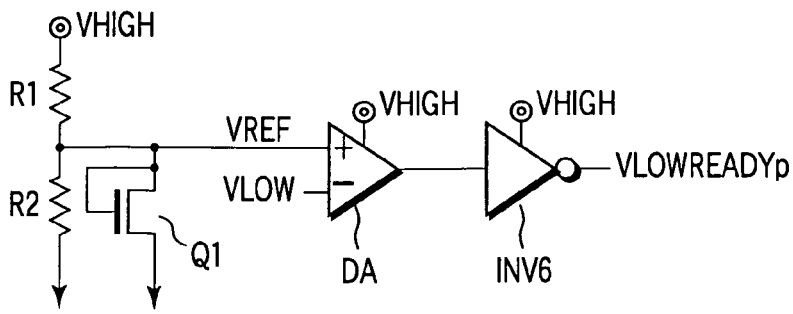
FIG. 10 is a circuit diagram of a first modification of the monitor circuit of the second embodiment.
Figure 11:
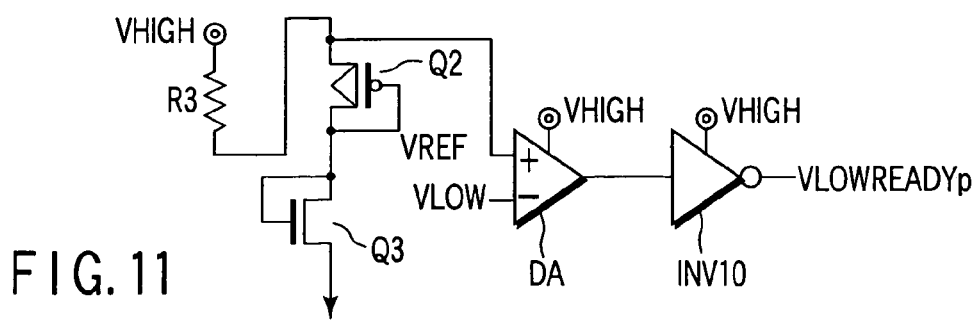
FIG. 11 is a circuit diagram of a second modification of the monitor circuit of the second embodiment.

It is to be noted that in a modification of the monitor circuit of the second embodiment, as shown in FIG. 10, the diode DI may also be replaced with a diode-connected NMOS transistor Q1. As shown in FIG. 11, diode-connected PMOS transistor Q2 and NMOS transistor Q3, which are connected in series, may be used instead.

(Third Embodiment)

Figure 12:
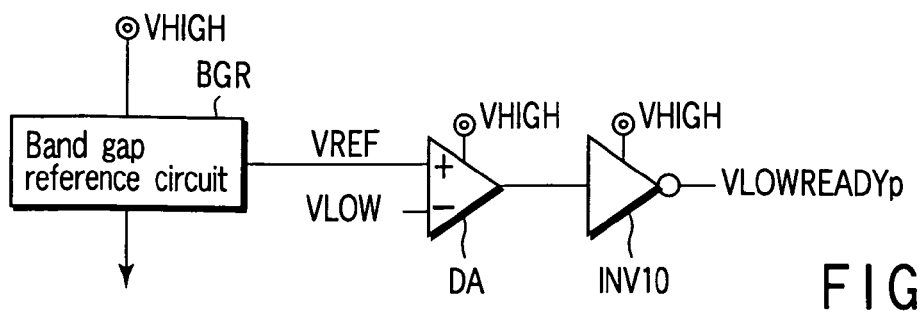
FIG. 12 is a circuit diagram of the VLOW monitor circuit according to a third embodiment.
Figure 13:
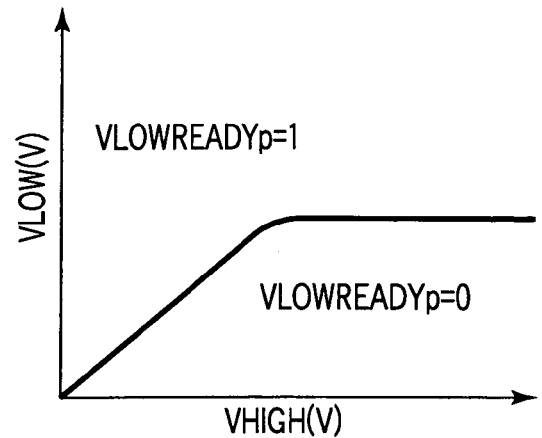
FIG. 13 is a characteristic diagram showing an output state of the VLOW monitor circuit of FIG. 12 in relation to the power supply voltages VHIGH/VLOW.

FIG. 12 is a circuit diagram of the level shifting circuit according to a third embodiment, and FIG. 13 is a characteristic diagram showing a relation between the output value and the power supply voltages VHIGH/VLOW.

The third embodiment is different from the first embodiment in that the reference potential generation circuit of VLOW monitor circuit MC is produced by a band gap reference circuit BGR. The band gap reference circuit is capable of obtaining a reference potential having small temperature dependency, and is therefore broadly used. When the reference potential is produced by this circuit, the temperature dependency of VREF in the second embodiment are reduced. When the second power supply voltage VHIGH has a defined value, it can be judged by a determined value whether the first power supply voltage VLOW is high or low. Therefore, the VLOW monitor circuit MC is prevented from narrowing a VLOW operation range.

Figure 14:
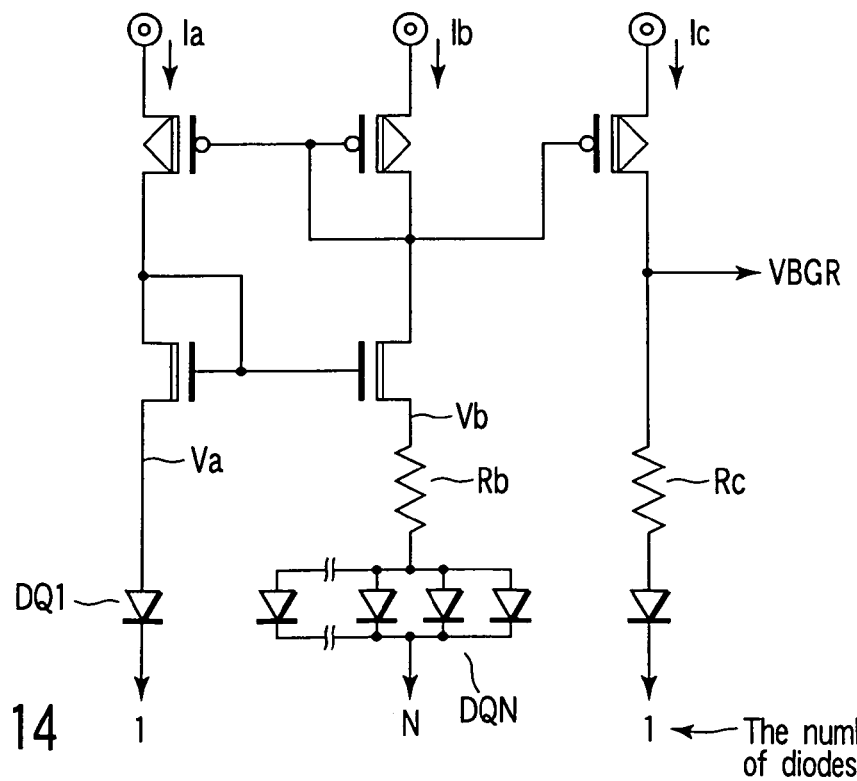
FIG. 14 is a circuit diagram showing an example of a band gap reference circuit.

A known band gap reference circuit is usable, and an example is shown in FIG. 14. In FIG. 14, currents Ia, Ib, Ic have a relation of Ia=Ib=Ic=I owing to a current mirror circuit configuration. A difference between the forward voltages of one diode DQ1 and N diodes DQN appears between opposite ends of a resistance Rb. Resistance Rc is applied with a voltage Rc/Rb times that appearing on the resistance Rb. An output voltage VBGR satisfies the relation VBGR=Va+Rc×I=Va+(Rc/Rb)×Vt×1n(N), where Va denotes a potential on an anode side of the diode DQ1, and Vt denotes a threshold value of the diode.

The voltages appearing on the opposite ends of Rb have positive temperature characteristics, and Va has negative temperature characteristics. If a ratio of Rc to Rb and the number N of diodes arranged in parallel are appropriately set, the output voltage VBGR having little temperature dependency can be taken out.

(Fourth Embodiment)

FIG. 15 is a circuit diagram showing an application of the level shifting circuit of the first to third embodiments, and the level shifting circuit of FIG. 5 is inserted between a logic circuit of DRAM and a sense amplifier in this circuit diagram. That is, the logic circuit of FIG. 15 corresponds to the first circuit block CB1 of FIG. 5, and the sense amplifier corresponds to the second circuit block CB2. A converter LC1 corresponds to a part surrounded with a dotted line in the level shifting circuit of FIG. 5.

A high voltage is used in the power supply voltage of a DRAM memory cell array portion, unlike the power supply voltage of the logic circuit. A signal activating the DRAM is a logic output using VLOW. On the other hand, a signal activating the sense amplifier of the DRAM has to be a signal having a VHIGH amplitude. Therefore, the level shifting circuit needs to be interposed between both the signals.

When the power supply voltage VLOW of a logic section is lower than a normal level, and only a power supply voltage VHIGH of the DRAM section is normal, a DRAM activated signal indicates an unstable level, and the sense amplifier is sometimes activated. Especially, when a sense amplifier is activated with a bit line pair being equalized, a feedthrough current is generated between VHIGH and GND, as shown in FIG. 15 with a bold arrow line. In general, there are several hundred pairs of bit line in a memory area, so that the above feedthrough current cannot be neglected.

If the embodiment of the present invention is applied, even when the power supply voltage VLOW is lower than the usual level, there is brought a logic state in which the output of the level shifting circuit does not allow the sense amplifier to operate, and it is possible to prevent the sense amplifier from being activated.

It is to be noted that, needless to say, any of monitor circuits of FIGS. 8, 10 to 12 is usable in the converter LC1 in FIG. 15.

In this manner, according to the above-described embodiments, there is provided a semiconductor device which can prevent a circuit from being inadvertently active, the circuit using a second power supply voltage and being supplied with an input signal level-shifted from a first voltage level which is supplied from the first power supply, in a case where the first voltage level drops below a defined value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first circuit block which operates on a first power supply voltage to output a first digital signal having an amplitude equal to that of the first power supply voltage;
a level shifting circuit into which the first digital signal is input and which converts the amplitude of the first digital signal to an amplitude equal to that of a second power supply voltage to output as a second digital signal via an output terminal; a second circuit block which operates on the second power supply voltage and into which the second digital signal is input; and
a monitor circuit which produces a reference voltage obtained by dividing the second power supply by resistors and having an upper limit restricted by a diode, said monitor circuit configured to compare the reference voltage with the first power supply voltage to produce a first signal to set the output terminal of the level shifting circuit to a predetermined potential in a case where the first power supply voltage drops below the reference voltage.

2. The semiconductor device according to claim 1, wherein the output terminal of the level shifting circuit is set to the predetermined potential to inactivate the second circuit block.

3. The semiconductor device according to claim 1, wherein the first power supply voltage is lower than the second power supply voltage.

4. The semiconductor device according to claim 1, wherein the first circuit block includes an inverter to produce a complementary signal of the first digital signal, and the level shifting circuit includes a flip flop into which the complementary signal is input.

5. The semiconductor device according to claim 1, wherein the monitor circuit produces the first signal to interrupt an operation of the level shifting circuit and to set the output terminal of the level shifting circuit to the predetermined potential in a case where the first power supply voltage drops below the reference voltage.

6. The semiconductor device according to claim 1, wherein the monitor circuit comprises a differential amplifier which compares the reference voltage with the first power supply voltage.

7. The semiconductor device according to claim 1, wherein the second circuit block is a sense amplifier of a dynamic random access memory.

8. The semiconductor device according to claim 7, wherein the output terminal of the level shifting circuit is set to the predetermined potential to inactivate the sense amplifier circuit.

9. The semiconductor device according to claim 7, wherein the second power supply voltage is higher than the first power supply voltage.

10. The semiconductor device according to claim 7, wherein the first circuit block includes a first inverter to produce a complimentary signal of the first digital signal, and the level shifting circuit includes a flip flop into which the complementary signal is input.

11. The semiconductor device according to claim 7, wherein the monitor circuit produces the first signal to interrupt an operation of the level shifting circuit and to set the output terminal of the level shifting circuit to the predetermined potential in a case where the first power supply voltage drops below the reference voltage.

12. The semiconductor device according to claim 7, wherein the monitor circuit comprises a differential amplifier which compares the reference voltage with the first power supply voltage.

* * * * *